US012707603B2

(12) United States Patent
Cheung et al.

(10) Patent No.: US 12,707,603 B2
(45) Date of Patent: Aug. 11, 2026

(54) LIQUID COOLING SYSTEM FOR SERVER HARDWARE

(71) Applicant: Microsoft Technology Licensing, LLC, Redmond, WA (US)

(72) Inventors: Rick Chun Kit Cheung, Redmond, WA (US); Chenwei Liu, Milpitas, CA (US); Unnikrishnan Vadakkanmaruveedu, Chandler, AZ (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 233 days.

(21) Appl. No.: 18/601,439

(22) Filed: Mar. 11, 2024

(65) Prior Publication Data

US 2025/0287548 A1 Sep. 11, 2025

(51) Int. Cl.
*H05K 7/20* (2006.01)
*H05K 7/14* (2006.01)

(52) U.S. Cl.
CPC ....... *H05K 7/20772* (2013.01); *H05K 7/1487* (2013.01); *H05K 7/1489* (2013.01); *H05K 7/20781* (2013.01)

(58) Field of Classification Search
CPC ........... H05K 7/20772; H05K 7/20781; H05K 7/20272; H05K 7/20254; H05K 7/20836; H05K 7/20809; H05K 7/20281; H05K 7/20327; H05K 1/0203; H05K 7/20218; H05K 7/20381; H05K 7/2039; H05K 7/20263; H05K 7/20727; H05K 7/20818; H05K 1/0204; H05K 2201/064; H05K 2201/066; H05K 7/20; H05K 7/20145; H05K 7/20409; H05K 7/20763; H05K 7/208; H05K 7/20927; H05K 7/209; G06F 1/20; G06F 2200/201; G06F 1/206; H01L 23/473; H01L 23/427; H01L 2023/4037; G11B 33/1413; H01M 10/6567
See application file for complete search history.

(56) References Cited

U.S. PATENT DOCUMENTS

| | | | | |
|---|---|---|---|---|
| 7,639,499 B1 * | 12/2009 | Campbell | .......... | H05K 7/20772 165/104.19 |
| 9,351,428 B2 * | 5/2016 | Eckberg | .................. | F16L 37/34 |
| 10,188,016 B2 * | 1/2019 | Lunsman | ........... | H05K 7/20263 |
| 10,299,413 B2 * | 5/2019 | Cui | ...................... | H05K 7/1487 |
| 10,905,031 B1 * | 1/2021 | Gao | ................... | H05K 7/20772 |
| 11,178,795 B1 * | 11/2021 | Gao | .......................... | G06F 1/20 |
| 2008/0310104 A1 * | 12/2008 | Campbell | .......... | H05K 7/20781 29/729 |
| 2010/0101765 A1 * | 4/2010 | Campbell | .......... | H05K 7/20809 361/699 |
| 2010/0103618 A1 * | 4/2010 | Campbell | .......... | H05K 7/20772 361/699 |
| 2019/0281730 A1 * | 9/2019 | Gao | ................... | H05K 7/20781 |
| 2019/0373776 A1 * | 12/2019 | Gao | ................... | H05K 7/20772 |
| 2020/0305310 A1 * | 9/2020 | Alissa | .................... | H05K 7/203 |

(Continued)

*Primary Examiner* — Michael A Matey
(74) *Attorney, Agent, or Firm* — Holzer Patel Drennan

(57) ABSTRACT

A disclosed server liquid cooling system includes a chassis coolant manifold housed in a base portion of a chassis below a PCB of the chassis. The chassis coolant manifold is adapted to cool server hardware on the PCB by circulating a liquid coolant throughout channels below the PCB between a coolant inlet and a coolant outlet.

19 Claims, 4 Drawing Sheets

(56) References Cited

U.S. PATENT DOCUMENTS

| | | | | |
|---|---|---|---|---|
| 2021/0084793 | A1* | 3/2021 | Gao | H05K 7/20281 |
| 2021/0153390 | A1* | 5/2021 | Tufty | H05K 7/20772 |
| 2022/0408607 | A1* | 12/2022 | Gao | H05K 7/20318 |
| 2023/0048500 | A1* | 2/2023 | Malouin | H05K 7/20236 |
| 2023/0056298 | A1* | 2/2023 | Gao | H05K 7/20772 |

* cited by examiner

LIQUID COOLING SYSTEM FOR SERVER HARDWARE

BACKGROUND

Within a data center, it is common to house server hardware within enclosures, referred to as "chassis," that slide in and out of corresponding slots (e.g., similar to drawers) in a rack. In some designs, each chassis includes a single server with a cooling system that includes one or more fans, liquid cooling loops, or some combination of thereof (e.g., a "hybrid cooling system"). Since liquid cooling systems remove heat more efficiently than air-based cooling systems, liquid and hybrid cooling systems are increasingly common in data centers that support high-heat server applications, such as machine learning applications with high GPU usage.

SUMMARY

According to one implementation, a liquid cooling system includes a server chassis storing a PCB supporting server hardware. The chassis including sidewalls and a base portion underlying the server hardware and supporting the sidewalls. The base portion houses a chassis coolant manifold adapted circulate a liquid coolant in a plane below and substantially parallel to the PCB.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

DETAILED DESCRIPTION

Figure 1:
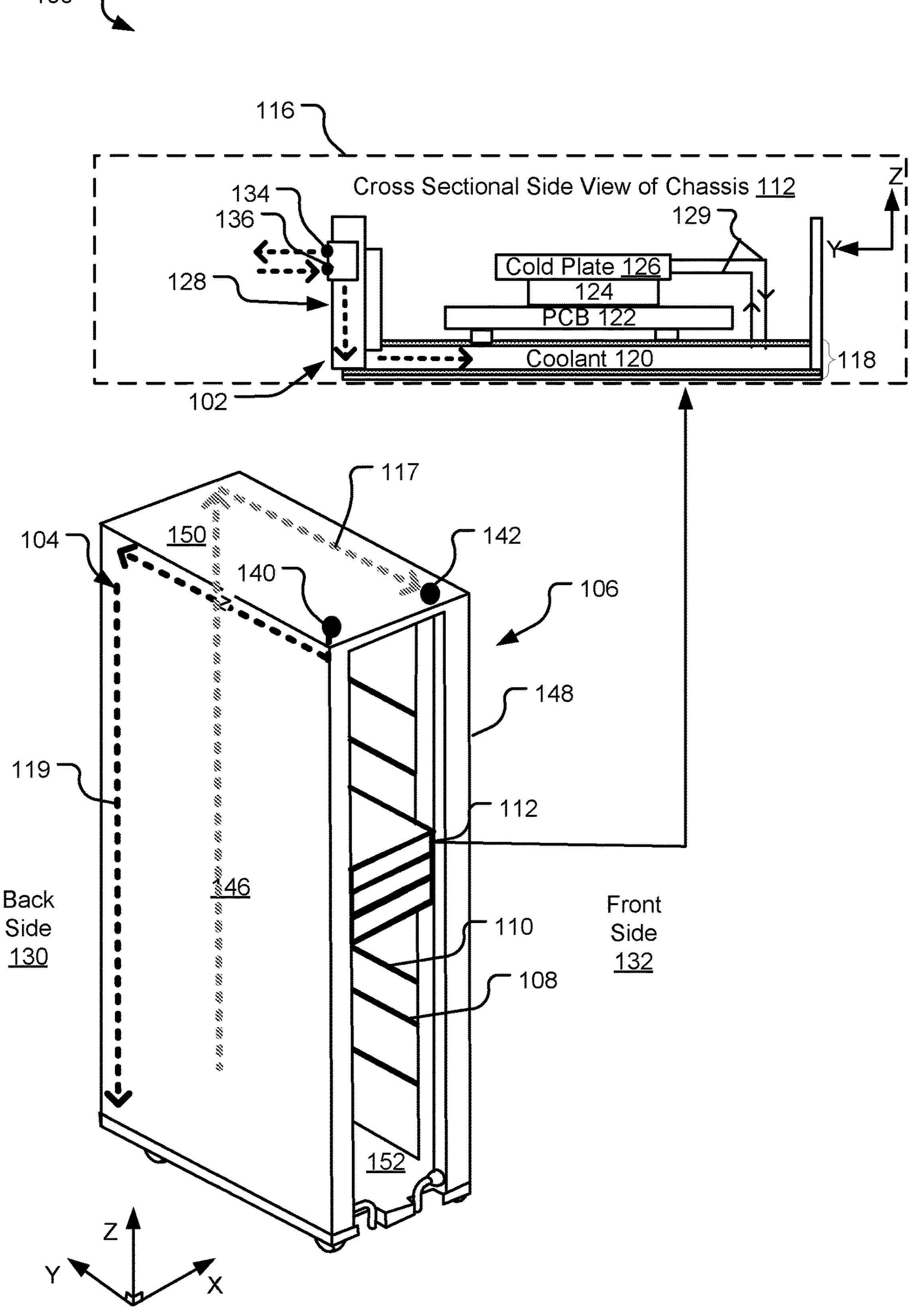
FIG. 1 illustrates example server hardware implementing a liquid cooling system that includes an integrated chassis coolant manifold and an integrated rack coolant manifold.

In a typical data center configuration, a rack stores multiple different trays or "chassis" in different vertically-stacked slots (e.g., rails or shelves). As used herein, chassis refers to an enclosure that stores computer hardware and that is stored within the slot of a rack, and the term rack is used to refer to a structure that includes multiple slots each adapted to receive and store a different chassis. Fans pull cold air from the front side of the rack and output hot air on the back side of the rack. This creates significant heat on the back side of the rack. For this reason, the term "hot aisle" is often used to refer to the aisle behind a row of racks. In a typical data center in the United States, the hot aisle behind a row of racks routinely reaches temperatures between 35 and 40 degrees Celsius. In data centers located in other countries with more relaxed safety requirements, hot aisle temperatures can routinely reach much warmer than 40 degrees Celsius. This creates significant operational challenges in relation to ensuring operator safety during service operations that require physical access to the hot aisle.

In the above-described rack configurations that incorporate liquid cooling, liquid coolant is supplied to each chassis through a coolant manifold attached to the rack. Typically, a rack coolant manifold is assembled on-site at the data center and then attached to the rack via common attachment hardware such as brackets and screws, which make it prone to damage from shock and vibration. In these designs, the rack coolant manifold is designed for permanent attachment to the rack and is, therefore, complicated to remove. To ensure each chassis can be accessed and removed for servicing from the front side of the rack without removing the coolant manifold, it is common to attach the coolant manifold to the back side of the rack. Since coolant shut-off valves are, along with the rest of the coolant manifold, located on the back side of the rack, an operator may need to access the dangerous above-mentioned hot aisle to access the coolant shut-off valves and to conduct other repair operations when the liquid cooling system malfunctions. This creates safety concerns.

In addition to these rack servicing challenges, current liquid cooling system designs are also sub-optimal at the chassis level. In a common design, each chassis includes a PCB that supports the server hardware within the chassis, and components on the PCB are liquid-cooled by cold plates that receive current from a primary coolant manifold. The primary coolant manifold is located above the PCB in the same general area that is occupied by the server hardware. The primary coolant manifold occupies significant space (e.g., ¼ or more of the internal chassis area) and therefore significantly encroaches upon space that would otherwise be available for use to storage, memory, and network components along with routing cables and the PCB itself. Due to space constraints, the shape and location of the primary coolant manifold is commonly dictated by space availability rather than functionality. Consequently, a complex web of tubing is used to deliver coolant from the primary coolant manifold to each of various cold plates within the chassis at various distances from the primary coolant manifold.

The above-described chassis cooling system is complicated to assemble and challenging to service. In scenarios where the coolant system malfunctions and develops a leak, hardware components proximal to the leak may be saturated with coolant and severely damaged. Servicing these damaged electronic components within these chassis generally entails removing the primary coolant manifold along with some or all of the complex web of tubing that abridges the primary coolant manifold and the individual cold plates on the PCB. After servicing a damaged component, the cooling system tubing and primary manifold are then reassembled within the chassis. This removal and replacement of cooling system components is time consuming and increases the cost of routine data center repairs.

The herein disclosed technology includes a liquid cooling system with characteristics that reduce cooling system malfunctions and that eliminates the above-described challenges pertaining to cost and safety when servicing chassis and/or racks within a data center. The disclosed cooling system includes an integrated chassis coolant manifold design and an integrated rack coolant manifold design. While the two designs are complimentary and may be used together, some implementations provide for use of the chassis coolant manifold without the rack coolant manifold or vice versa.

According to one implementation, a liquid cooling system includes a chassis coolant manifold that is integrated within a chassis and more specifically located within a base portion of the chassis that underlies the PCB and server hardware supported by the PCB. The chassis coolant manifold circulates coolant throughout one or more coolant channel within a plane below the PCB that is substantially parallel to (e.g., +/−5% of parallel) the PCB. The disclosed chassis cooling system increases the amount of space available for occupation by server hardware and also increases accessibility to such components (decreasing servicing costs) due to relocation of the primary manifold to the base portion of the chassis underlying the PCB. Further, the location of the primary manifold under the PCB also decreases damage resulting from occasional leaks of the cooling system due to the fact that liquid coolant is contained below the PCB and cannot drip onto the PCB from above.

According to another implementation, the liquid cooling system includes a rack coolant manifold that is integrated within a rack (e.g., to circulate coolant around a perimeter of the rack) and adapted to deliver liquid coolant to each of multiple chassis positioned in different chassis slots of the rack. The rack coolant manifold has a unique architectural design that locates primary inlet/outlet valves (e.g., rack shut-off values) on a front side of the rack rather than on the back as in previous designs. Because these primary inlet/outlet valves are located on the front side of the rack, an operator can shut off and restore the flow of coolant without accessing the hot aisle space behind the rack. In one implementation, servicing the rack coolant manifold entails shutting the primary inlet/outlet valves on the front side of the rack, disconnecting hoses from the primary inlet/outlet valves, and wheeling the rack away from its position to a safe-temperature space. These and other advantages are made apparent with respect to examples provided by the figures, discussed below.

FIG. 1 illustrates example server hardware 100 implementing a liquid cooling system that includes a first coolant manifold integrated within a chassis (referred to herein as an integrated chassis coolant manifold 102) and a second coolant manifold integrated within a rack (referred to herein as an integrated rack coolant manifold 104). The server hardware 100 includes a rack 106 having a rectangular frame and multiple chassis slots 108, 110 (e.g., rails or shelves) each sized to store and receive a chassis (e.g., a chassis 112).

Example characteristics of the chassis 112 are shown in detail in cross-sectional view 116. The chassis 112 includes a PCB 122 that provides electrical connections and power to various server hardware. As used herein, "server hardware" references to electrical components and resources included in or used by servers. By example, the PCB 122 includes the electrical components of a individual server including one or more processors (e.g., one or more central processing units (GPUs) or graphics processing units (GPUs), memory including random access memory and solid-state storage and/or hard disk drives, fan assembly, basic input/output system (BIOS), and network interface controllers (NICs). In another implementation, the PCB 122 supports resources used by one or more other servers coupled to the chassis 112 that is, for example, co-located within the rack 106.

The PCB 122 is encased by sidewalls of the chassis 112 (e.g., front, back, left and right sidewalls that all extend upward and generally perpendicular to the base portion 118). Although not shown in FIG. 1, the chassis 112 may in some implementations include a top wall such that the PCB 122 and the server components supported by the PCB 122 are fully encased within a compartment of the chassis 112. The sidewalls of the chassis 112 are supported by a base portion 118 of the chassis 112 that includes some or all components of the integrated chassis coolant manifold. The base portion 118 receives and circulates a liquid coolant 120 in a region below the PCB 122. Although not visible in the views of FIG. 1, the liquid coolant 120 is circulated throughout a coolant loop including one or more channels that run below and substantially parallel to the plane of the PCB 122. This coolant loop is described herein as "below" the PCB 122 because it is defined within a plane having a lower z-axis position than the PCB 122, where the z-axis is refers to the direction of gravitational force. In one implementation, the coolant loop within the base portion 118 is sized and positioned to underly or substantially underly the PCB 122 such that any point on the PCB 122 is axially aligned, in the z-direction, with the liquid coolant 120 circulating the in base portion 118. In other implementations, the coolant loop is sized and shaped within the base portion 118 such that some portions of the PCB 122 are not axially aligned, in the Z-direction, with the circulating liquid coolant 120.

Various components on the PCB 122 that generate heat and/or that are especially heat sensitive are, by design, placed in contact with dedicated cold plates that receive the liquid coolant 120 from the base portion 118 of the chassis 112. By example, the cross-sectional view 116 illustrates a single heat-generating component 124 that is on the PCB 122 and that is in contact with a cold plate 126. The liquid coolant 120 is routed up to the cold plate 126 via tubing 129 which may, in various implementations, be routed either up and around the edge of the PCB 122 (as shown) or instead directly through vias formed in the PCB 122.

Because a primary portion of the integrated chassis coolant manifold 120 is housed in the base portion 118 below the PCB 122, significant space is freed up and available for occupation by electronic components within the chassis 112. Moreover, the location of the liquid coolant 120 in a plane below the PCB 122 makes it easier to access and service the server hardware on the PCB 122 than in existing designs where the primary coolant manifold is located, along with a complex web of tubing, above the PCB 122 and the server hardware. Further still, the design of the chassis coolant manifold 102 minimizes electrical component damage that results from leaks and ruptures of the coolant loop. For example, a rupture of the primary coolant loop in the base portion 118 may result in the accumulation or pooling of some coolant outside of the base portion 118 (e.g., either below the chassis 112 or between the base portion 118 and the PCB 122), but the liquid coolant 120 but would not in such scenarios flow down onto the PCB 122 in large quantities from above, as in existing designs where the primary coolant manifold is housed above the PCB 122.

In the illustrated implementation, the liquid coolant 120 flows into the chassis 112 through a coolant inlet 134 located on a back wall 128 of the chassis 112. After circulating through the coolant loop in the base portion 118, the liquid coolant 120 exits the chassis 112 through a coolant outlet 136 that is also located on the back wall 128 of the chassis 112.

When the chassis 112 is positioned within a corresponding chassis slot of the rack 106 (as shown), the back wall 128 of the chassis 112 faces a back side 130 of the rack 106. The chassis 112 is inserted into and selectably removed from the rack 106 on a front side 132 of the rack, which is opposite the back side 130. When the chassis 112 is inserted into a corresponding one of the chassis slots 108, 110 in the rack 106, the coolant inlet 134 and coolant outlet 136 of the chassis 112 mate with supply lines (e.g., a cold channel supply line 119) of the rack coolant manifold 104 in positions proximal to a back side 130 of the rack.

In one implementation, the coolant inlet 134 and coolant outlet 136 of the chassis 112 include quick disconnect (QD) valve components (e.g., male or female components) adapted to selectably mate and un-mate with corresponding quick disconnect valve components of the rack coolant manifold 104. For example, an operator's "push" on the chassis 112 into the corresponding chassis slot from the front side 132 of the rack 106 forcibly completes a first QD connection seal between the coolant inlet 134 and a cold channel supply line 119 of the rack coolant manifold 104 and also forcibly completes a second QD connection seal between the coolant outlet 136 of the chassis 112 and a hot channel supply line 117 of the rack coolant manifold 104. Likewise, in the above-described implementation, an operator's "pull" on the chassis 112 in the reverse direction (e.g., pulling on the chassis from the front side 132 in the y-direction away from the chassis) acts as a quick disconnect action that releases the first and second QD connection seals, disconnecting the chassis coolant manifold 102 from the rack coolant manifold 104, while also sealing off the respective QD valve components to safely contain the liquid coolant 120 that is within the chassis 112 and the rack 106, respectively.

In implementations that utilize hybrid cooling systems, each of the chassis in the rack 106 may include one or more fans that intake cold air from the front side 132 of the rack 132 and that output hot air on the back side 130 of the rack 106. Therefore, the back side 130 of the rack 106 may be prone to much higher temperatures during normal operating conditions that can be dangerous to human operators. The above-described use of quick-disconnect valves ensures that the chassis coolant manifold 102 can be securely coupled with and decoupled from its coolant source (e.g., the rack coolant manifold 104) without an operator being physically present on the back side 130 of the rack 106.

In the disclosed design, the rack coolant manifold 104 is integrated within the rack 106, which is defined by a least a first sidewall 146, a second sidewall 148, and various lateral support members (e.g., a base 152 and a top 150) extending between and connecting the first sidewall 146 to the second sidewall 148.

The rack coolant manifold 104 includes and includes coolant supply lines (e.g., a hot channel supply line 117 and a cold channel supply line 119) that are, in one implementation, formed integrally as part of the rack 106 such that they are at internal to outer surfaces of the rack 10 and/or encased within one or more of the sidewalls 146, 148, top 152, or base 150 of the rack.

The rack coolant manifold 104 includes a coolant inlet 140 and a coolant outlet 142 accessible on the front side 132 of the rack 106. In operation, the coolant inlet 140 and coolant outlet 142 include shut-off valves that connect to hosing that carries the liquid coolant between the rack 106 and an external coolant reservoir (not shown). From the coolant inlet 140, the cold channel supply line 119 routes incoming coolant laterally (e.g., in the y-direction) by along an edge of rack sidewall 146 and toward the back side 130 of the rack 106 and the directs the coolant vertically (downward, in the z-direction) along the back side 130 of the rack 106 to distribute the coolant to the various chassis stored in the rack 106.

When the chassis 112 is positioned within the rack 106, coolant flowing out through the coolant outlet 136 of the chassis 112 is received into the hot channel 117 of the rack coolant manifold 104. The hot channel 117 then directs the coolant upward in the z-direction along another sidewall of the rack 106 (e.g., the sidewall that is behind and parallel to the sidewall 146) and laterally from the back side 130 of the rack 106 to the coolant outlet 142, as shown. Since the shut-off valves of the coolant inlet 140 and coolant outlet 142 can be accessed from the front side 132 of the rack, the rack 106 can be disconnected from the external coolant reservoir without operator access to the back side 130 of the rack 106.

Moreover, the integration of the rack coolant manifold 104 into the structure of the rack 106 decreases its vulnerability to damage from shock and vibration as compared to manifold designs that require assembly separate from and subsequent attachment to the rack 106.

Figure 2:
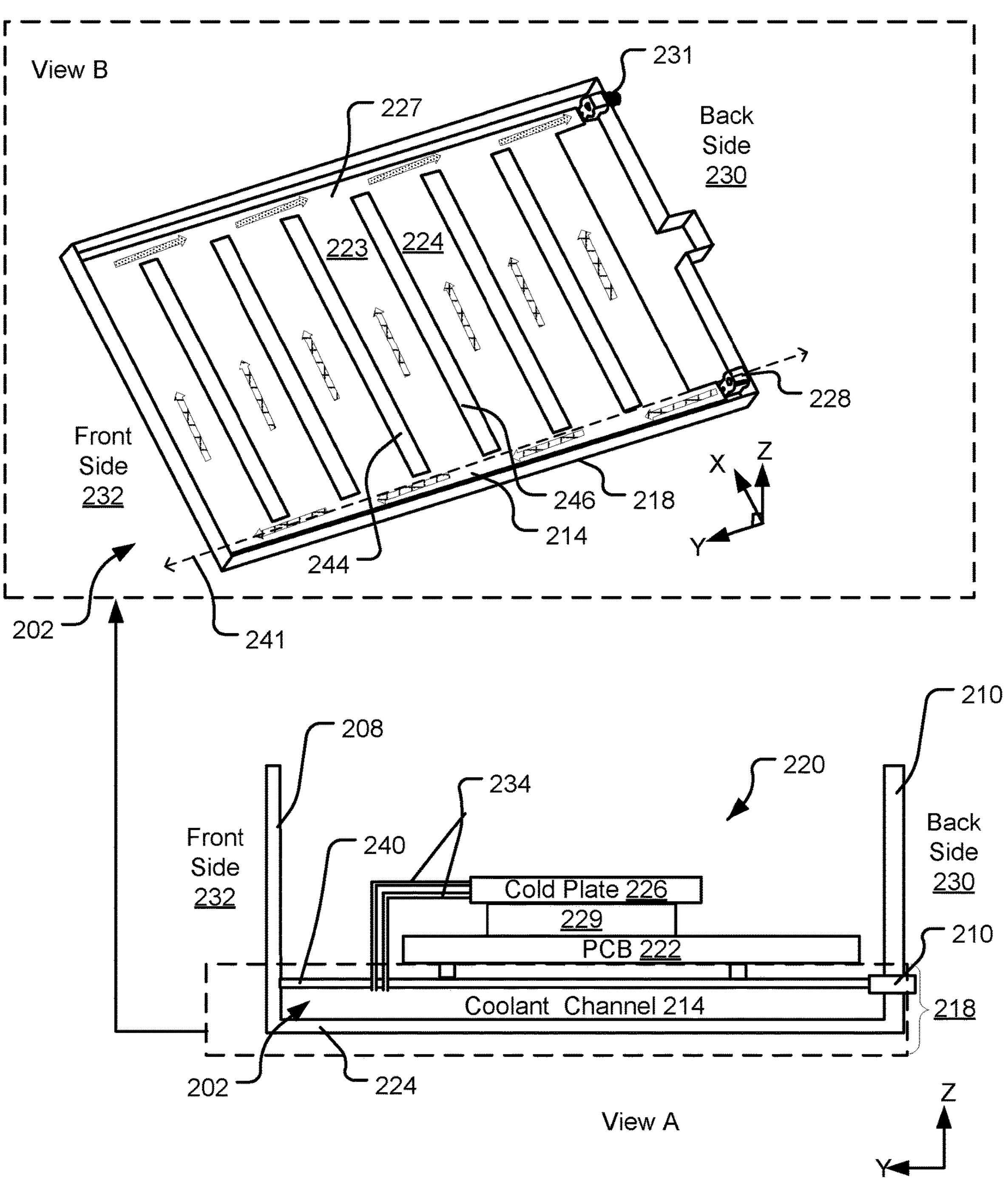
FIG. 2 illustrates aspects of an example chassis with a base portion housing an integrated chassis coolant manifold.

FIG. 2 illustrates aspects of an example chassis 200 with a base portion 218 housing an integrated chassis coolant manifold 202. The View A shows a cross-sectional view of the chassis 200 when viewed from the side. View B, in contrast, shows a perspective top view of the base portion 218 of the chassis 200 with various components of View A removed to more fully illustrate aspects of the integrated chassis coolant manifold 202, The chassis 200 has features the same or similar to those described above with respect to FIG. 1 including sidewalls (e.g., a front sidewall 208, a back sidewall 210, as well as left and right sidewalls (not shown)) and the base portion 218 supporting the sidewalls. The base portion 218 and sidewalls encloses a compartment 220 that houses a PCB 222 that provides data and power connections to various server hardware components attached to the PCB 222. In one implementation, the PCB 222 supports a full server including various components of a processing system, memory, and network components.

For simplicity of concept, the PCB 222 is shown supporting a single heat-generating computer component 229 placed in proximity of cold plate 226 that receives liquid coolant from the integrated chassis coolant manifold 202. Tubing 234 routes coolant between the cold plate 226 and the integrated chassis coolant manifold 202 in the base portion 218.

As shown more clearly in View B, the integrated chassis coolant manifold 202 includes a coolant inlet 228, a coolant outlet 231, and a coolant loop defined by various interconnecting channels in the base portion 218 (e.g., channels 223, 224, 227, 214 shown in View B) that extend between the coolant inlet 228 and the coolant outlet 231). The cross-section of View A is taken as a slice of the Y-Z plane taken through axis 241, shown in View B, which runs parallel to and through the coolant channel 214. Both the coolant inlet 228 and the coolant outlet 231 are located on a back side 230 of the chassis 200 that rests proximal to a back side of rack (not shown) when the chassis 200 is inserted into a slot in the rack, as generally shown and described with respect to FIG. 1.

Coolant enters the base portion 218 of the chassis 200 through the coolant inlet 228, which includes a quick disconnect (QD) valve component adapted to mate with a corresponding QD valve component in of chassis-external coolant source, such as the rack coolant manifold described with respect to FIG. 1. After entering the base portion 218, the coolant is pushed in a counter-clockwise manner through the various channels formed in the base portion 218, eventually exiting the base portion 218 through a coolant outlet 231, which also includes a QD valve component adapted to mate with a corresponding QD valve component of a chassis-external coolant source. When the base portion 218 is decoupled from the chassis-external coolant source (as shown), the QD valve components in the coolant inlet 228 and the coolant outlet 231 are sealed. When a y-direction force is applied to mate the chassis 200 with the chassis-external coolant source, the QD valve components mate and seal against their counterpart valve components, opening to allow the flow of coolant as shown.

In various implementations, the integrated chassis coolant manifold 202 may include channels of various geometries. In FIG. 2, View B, the integrated chassis coolant manifold 202 is shown to include outer channels 214, 227 that steer the coolant along the y-direction length of the base portion 218 and a plurality of inner channels (e.g., channels 223 and 224) that receive the coolant from the outer channel 214 and direct the coolant along the x-direction width of the base portion 218 to the outer channel 227. In this way, the coolant is flowed throughout a loop residing within a plane parallel to and beneath the PCB 222.

In one implementation, the various channels of the integrated chassis coolant manifold 202 are defined by sheet metal. As shown in View A, the outer channels (e.g., channels 214 and 227) and the inner channels (e.g., the channels 223, 224) are encased between a top piece of sheet metal 240 and a bottom piece of sheet metal 242 with further metal sheets (e.g., metal sheets 244, 246) extending in the z-direction and connecting the top piece of sheet metal 240 to the bottom piece of sheet metal 244.

The PCB 222 is mounted on top of the second piece of sheet metal 240 in plane parallel to the plane in which the coolant circulates throughout the base portion 218. Liquid-tight seals are formed at the junctures between tubing 236 tunnels and vias drilled through the top piece of sheet metal 240. In the illustrated implementation, the tubing 238 is wrapped up and around the PCB 222 rather than tunneling through the PCB 222. This configuration advantageously preserves space on the PCB 222 that can be used to provide electrical connections to the various server hardware components. In another implementation with more relaxed spacing constraints on PCB, the tubing 234 is tunneled up and through vias formed in the PCB 222. This configuration advantageously reduces the length of tubing 234 channels.

In various implementations, the integrated chassis coolant manifold 202 circulates different types of coolant. Notably, however, the channels of the integrated chassis coolant manifold 202 together with tubing 234 contains the liquid coolant in isolation from the server hardware (e.g., the sensitive electrical components are not submerged in or at risk of contacting the liquid coolant) so the coolant does not have to be a dielectric. In one implementation, the liquid coolant is water. In some implementations, the chassis 200 includes an air-based cooling system in addition to the integrated chassis coolant manifold 202. For example, the PCB 222 supports one or more fans that pull air from a front side 232 of the chassis, circulate the air throughout the compartment 220 above the PCB 222, and expel the air through vent(s) on the back side 230 of the chassis.

Other aspects of the chassis 200 not described explicitly with respect to FIG. 2 may be the same or similar to other implementations described herein.

Figure 3:
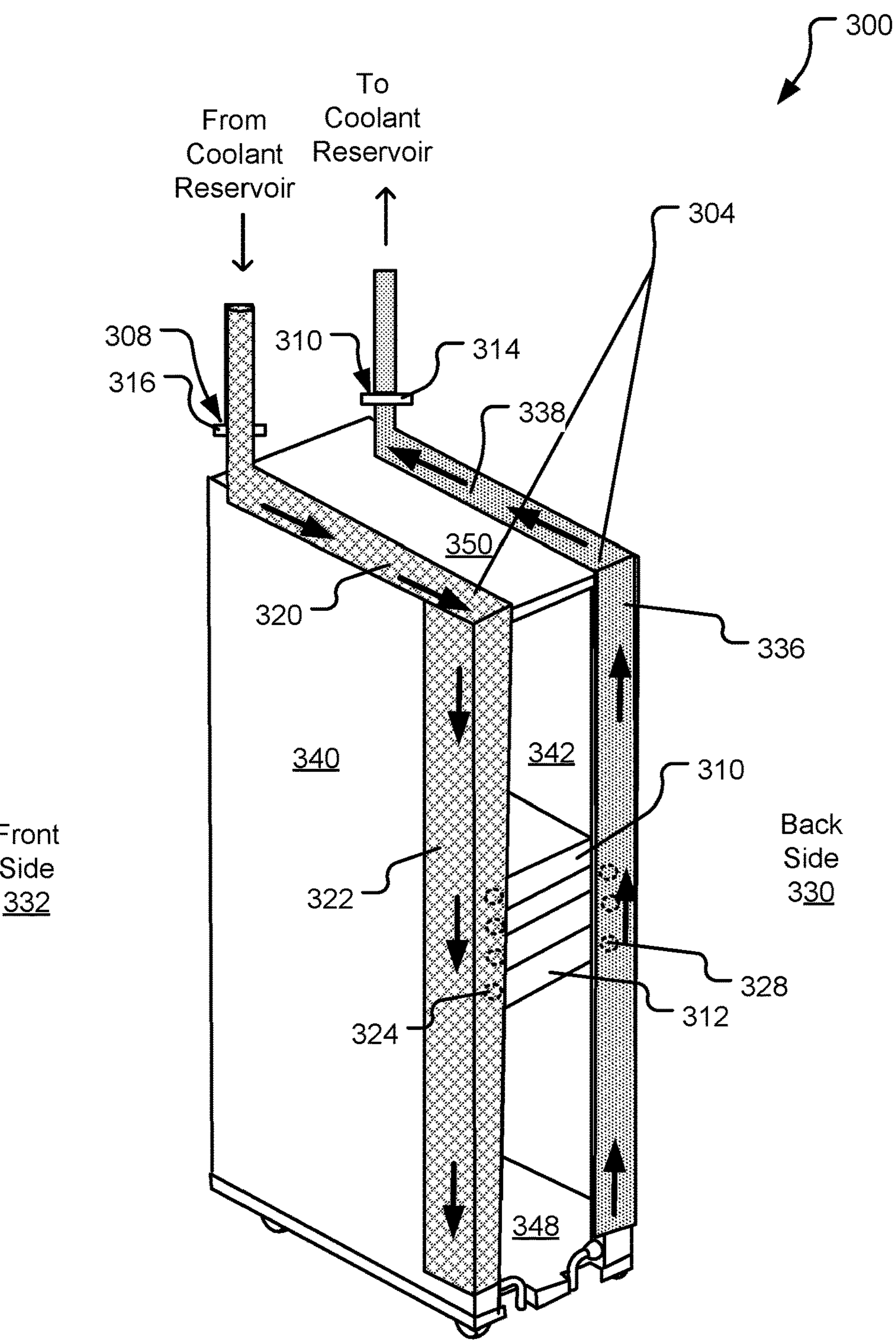
FIG. 3 illustrates a server rack including an example integrated rack coolant manifold.

FIG. 3 illustrates a server rack 300 including an example integrated rack coolant manifold 304. The server rack 300 is defined by a first vertical sidewall 340 and a second vertical sidewalls 342. The first vertical sidewall 340 is coupled to the second vertical sidewall 324 by lateral support members including a rack base 348 and a rack top 350. Internally, the rack 300 includes a number of chassis slots (not shown), that are for example, defined by rail bearings or shelves, with each of the chassis' slots being adapted to receive and support a chassis (e.g., chassis 311, 312) with characteristics the same or similar to the chassis 200 described with respect to FIG. 2. Each chassis is removably inserted into a corresponding one of the slots in the rack 300 through a front side of 332 of the rack 300 with a base portion of the chassis oriented substantially parallel to the rack base 348 and the rack top 350. In some implementations, the various chassis within the rack are visible and/or partially accessible from a back side 330 of the rack 300. In other implementations, the back side 330 of the rack 300 is defined by a solid back sidewall that incorporates a backplane with various electrical connections. In these implementations, the chassis may not be visible or accessible through the back side 330 of the rack 300. In FIG. 3, the back side 330 of the rack 300 is shown open or transparent to illustrate relative positions of the chassis 311, 312.

The integrated rack coolant manifold 304 is formed integrally as part of the rack 300 as opposed to being formed as a separate structure subsequently attached to the rack 300. As such, coolant channels of the integrated rack coolant manifold 304 that are housed internal to outer sidewalls (e.g., the sidewalls 340, 342) of the rack 300. The rack coolant manifold 304 includes a coolant inlet 308 and a coolant outlet 310 accessible from the front side 332 of the rack 300. In the illustrated implementation, the coolant inlet 308 and the coolant outlet 310 are shown on the top of the front side 332 of the rack but may, in other implementations, be located elsewhere such as on a lateral support member of the frame that forms a portion of a front of the rack 300 (e.g., near the rack base 348 or elsewhere on the front side 330). The coolant inlet 308 and a coolant outlet 310 include main shut-off valves 314 and 316 that couple to hosing that flows current to and from an external coolant reservoir (not shown).

Cooling flowing through the coolant inlet 308 is directed through a cold channel that includes a horizontal portion 320 and a vertical portion 322. The horizontal portion 320 of the cold channel carries the coolant horizontally from the front side 332 of the rack 300 to the back side 330 of the rack 300 where the current is then directed downward into the vertical portion 322. The vertical portion 322 includes chassis channel connectors, such as QD valves (e.g., a QD valve located at position 326), each adapted to mate with a corresponding connector on the back side 332 of a chassis when the chassis is positioned in a corresponding one of the different chassis slots in the rack 300.

From the vertical portion 322 of the hot channel, the coolant is distributed through the chassis channel connectors and into the various chassis positioned in the rack 300. Coolant circulates throughout each chassis (e.g., as generally described and shown with respect to FIG. 2), pulls heat from electronics within the chassis, and exits each chassis at a corresponding chassis coolant outlet (e.g., chassis coolant outlet shown at position 328). The warmed coolant is then received into a hot channel of the rack coolant manifold 304. The hot channel includes a vertical portion 336 and a horizontal portion 338. The vertical portion 336 receives the coolant from the various chassis and flows the warmed coolant upward vertically and into the horizontal portion 338 of the hot channel. The horizontal portion 338 of the hotel channel routes the warmed coolant toward the front side 330, ultimately flowing the coolant through coolant outlet 310 and to the external reservoir.

Other aspects of the rack 300 and/or chassis within the rack 300 not described explicitly with respect to FIG. 3 may be the same or similar to other implementations described herein.

Figure 4:
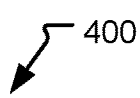
FIG. 4 illustrates example operations for operating a liquid cooling system that includes a chassis coolant manifold.
Figure 4:
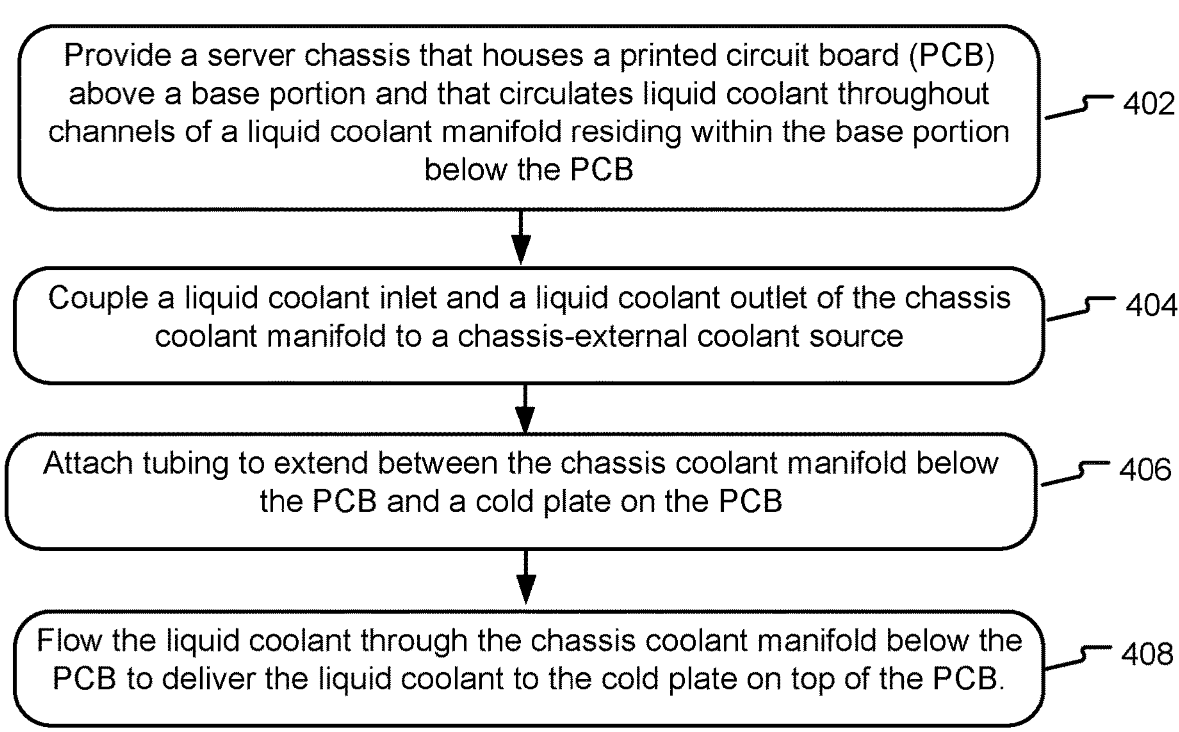

FIG. 4 illustrates example operations for operating a liquid cooling system that includes a chassis coolant manifold. A providing operation 402 provides a server chassis that houses a printed circuit board (PCB) supporting server hardware. The server chassis includes a base portion that circulates liquid coolant throughout channels of a chassis coolant manifold that reside a plane below the PCB. A couple operation 404 couples a coolant inlet and a coolant outlet of the chassis coolant manifold to a chassis-external coolant source, such as coolant supply lines integrated within or attached to a rack. An attachment operation 406 attaches tubing that extends between the chassis coolant manifold below the PCB and a cold plate on the PCB. A cooling operation 408 cools server hardware in proximity of the cold plate by flowing the liquid coolant through the coolant loop of the chassis coolant manifold thereby pumping the coolant through the tubing to the cold plate.

In some aspects, the techniques described herein relate to a system including: a chassis storing a printed circuit board (PCB) that supports server hardware, the chassis including: a base portion underlying the PCB; a chassis coolant loop housed within the base portion that circulates a liquid coolant throughout channels below the PCB between a coolant inlet and a coolant outlet; a cold plate positioned above the PCB and in proximity to a heat-generating component of the server hardware; and tubing extending between the chassis coolant loop below the PCB and the cold plate above the PCB that flows the liquid coolant between the cold plate and the liquid coolant loop to cool the heat-generating component.

In some aspects, the techniques described herein relate to a system, wherein the chassis is adapted for insertion into a rack with a front side of the chassis being accessible on a front side of the rack and wherein the coolant inlet and the coolant outlet are accessible on a back side of the chassis opposite the front side of the chassis.

In some aspects, the techniques described herein relate to a system, wherein the liquid coolant is circulated in channels throughout plane parallel to the base portion.

In some aspects, the techniques described herein relate to a system, wherein the liquid coolant is circulated through channels in the base portion of the chassis that isolate the liquid coolant from contact with the server hardware.

In some aspects, the techniques described herein relate to a system, wherein the chassis coolant loop is sandwiched between first and second pieces of sheet metal.

In some aspects, the techniques described herein relate to a system, further including a rack adapted to receive and support the chassis, the rack including: a frame including first sidewall, a second sidewall, and lateral support members extending between and connecting the first sidewall to the second sidewall; a chassis slot defined between the first sidewall and the second sidewall that is adapted to receive the chassis through a front side of the rack with the base portion of the chassis oriented substantially parallel to the lateral support members; a rack coolant manifold that flows the coolant to and from the chassis coolant loop, the rack coolant manifold having a coolant inlet and a coolant outlet accessible from the front side of the rack.

In some aspects, the techniques described herein relate to a system, wherein the rack coolant manifold includes a cold channel that receives a liquid coolant from an external coolant reservoir through a first valve accessible on the front side of the rack and that directs the liquid coolant toward a back side of the rack and vertically along the first sidewall to distribute the liquid coolant to the chassis stored in the rack.

In some aspects, the techniques described herein relate to a system, wherein the rack coolant manifold includes a hot channel that receives the liquid coolant through the coolant outlet of the chassis and directs the liquid coolant vertically along the second sidewall and to a second valve on the front side of the rack.

In some aspects, the techniques described herein relate to a system, wherein the cold channel includes a first connector adapted to mate with the coolant inlet of the base portion of the chassis and wherein the hot channel includes a second connector adapted to mate with the coolant outlet of the base portion of the chassis when the chassis is positioned within the chassis slot.

In some aspects, the techniques described herein relate to a method of cooling server hardware including: providing a chassis that houses a printed circuit board (PCB) supporting server hardware, the chassis including a base portion that circulates liquid coolant throughout channels of a chassis coolant manifold residing in a plane below the PCB; and coupling a coolant inlet and a coolant outlet of the chassis coolant manifold to a chassis-external coolant source; attaching tubing to extend between the chassis coolant manifold below the PCB and a cold plate on the PCB; and flowing the liquid coolant through the chassis coolant manifold below the PCB to deliver the liquid coolant to the cold plate on top of the PCB.

In some aspects, the techniques described herein relate to a method, wherein the chassis is adapted for insertion into a rack with a front side of the chassis being accessible on a front side of the rack and wherein the liquid coolant flows through a coolant inlet of the chassis to a coolant outlet of the chassis, wherein the coolant inlet and the coolant outlet both are located on a back side of the chassis opposite the front side of the chassis.

In some aspects, the techniques described herein relate to a method, wherein the chassis coolant manifold includes channels that isolate the liquid coolant from contact with the server hardware.

In some aspects, the techniques described herein relate to a method, wherein the channels of the base portion of the chassis throughout are sandwiched between first and second pieces of sheet metal substantially parallel to the PCB.

In some aspects, the techniques described herein relate to a method, further including: sliding the chassis into a chassis slot formed in a front side of a rack, the rack including a rack coolant manifold that flows coolant between the chassis-external coolant source and the chassis when the chassis is positioned in the chassis slot; and coupling the coolant inlet and the coolant outlet of the chassis to the rack coolant manifold at locations proximal to a back side of the rack, the rack coolant manifold having shut-off valves accessible from the front side of the rack.

In some aspects, the techniques described herein relate to a method, wherein the rack coolant manifold includes a cold channel that receives coolant from an external coolant reservoir through a first valve on the front side of the rack and that directs the coolant toward a back side of the rack and vertically along a first sidewall of the rack to distribute the coolant to the chassis stored in the rack.

In some aspects, the techniques described herein relate to a method, wherein the rack coolant manifold includes a hot channel that receives coolant output from the chassis and directs the liquid coolant vertically along a second sidewall and to a second valve on the front side of the rack, the second sidewall being parallel to the first sidewall.

In some aspects, the techniques described herein relate to a method, wherein the cold channel includes a first connector adapted to mate with the coolant inlet of the base portion of the chassis and wherein the hot channel includes a second connector adapted to mate with the coolant outlet of the base portion of the chassis when the chassis is positioned within the chassis slot.

In some aspects, the techniques described herein relate to a method, wherein flowing the liquid coolant between the channels below the PCB and the cold plate includes flowing the liquid coolant through channels that wrap around an edge of the PCB.

In some aspects, the techniques described herein relate to a storage system including: a chassis adapted to store a printed circuit board (PCB) that supports server hardware, the chassis including sidewalls and a chassis base portion underlying the server hardware and supporting the side-walls, the chassis base portion including a chassis coolant manifold adapted to flow coolant through a liquid coolant loop that underlies the PCB; and a rack including a plurality of chassis slots each adapted to receive the chassis through a front side of the rack, the rack including a rack coolant manifold with shut-off valves located on the front side of the rack.

In some aspects, the techniques described herein relate to a storage system, wherein the chassis is adapted for insertion into the rack with a front side of the chassis being accessible on a front side of the rack and wherein a coolant inlet and a coolant outlet of the chassis coupled with the rack coolant manifold on a back side of the rack opposite the front side of the rack.

The logical operations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language. The above specification, examples, and data, together with the attached appendices, provide a complete description of the structure and use of example implementations.

What is claimed is:

1. A system comprising:

a chassis storing a printed circuit board (PCB) that supports server hardware, the chassis including:

a base portion underlying the PCB;

a chassis coolant loop housed within the base portion that circulates a liquid coolant throughout channels below the PCB between a coolant inlet and a coolant outlet;

a cold plate positioned above the PCB and in proximity to a heat-generating component of the server hardware; and tubing extending between the chassis coolant loop below the PCB and the cold plate above the PCB configured to direct the liquid coolant between the cold plate and the chassis coolant loop to cool the heat-generating component; and a rack adapted to receive and support the chassis, the rack including:

a chassis slot adapted to receive the chassis through a front side of the rack; and a rack coolant manifold that flows the liquid coolant to and from the chassis coolant loop, the rack coolant manifold having a coolant inlet and a coolant outlet accessible from the front side of the rack.

2. The system of claim 1, wherein the chassis is adapted for insertion into a rack with a front side of the chassis being accessible on a front side of the rack and wherein the coolant inlet and the coolant outlet are accessible on a back side of the chassis opposite the front side of the chassis.

3. The system of claim 1, wherein the liquid coolant is circulated in channels throughout a plane parallel to the base portion.

4. The system of claim 1, wherein the liquid coolant is circulated through channels in the base portion of the chassis that isolate the liquid coolant from contact with the server hardware.

5. The system of claim 1, wherein the chassis coolant loop is sandwiched between first and second pieces of sheet metal.

6. The system of claim 1, wherein the rack further includes: a frame including a first sidewall, a second side-wall, and lateral support members extending between and connecting the first sidewall to the second sidewall, and wherein the chassis slot is defined between the first sidewall and the second sidewall and adapted to receive the chassis while the base portion of the chassis oriented substantially parallel to the lateral support members.

7. The system of claim 6, wherein the rack coolant manifold includes a cold channel that receives the liquid coolant from an external coolant reservoir through a first valve accessible on the front side of the rack and that directs the liquid coolant toward a back side of the rack and vertically along the first sidewall to distribute the liquid coolant to the chassis stored in the rack.

8. The system of claim 7, wherein the rack coolant manifold includes a hot channel that receives the liquid coolant through the coolant outlet of the chassis and directs the liquid coolant vertically along the second sidewall and to a second valve on the front side of the rack.

9. The system of claim 8, wherein the cold channel includes a first connector adapted to mate with the coolant inlet of the base portion of the chassis and wherein the hot channel includes a second connector adapted to mate with the coolant outlet of the base portion of the chassis when the chassis is positioned within the chassis slot.

10. A method of cooling server hardware comprising:

providing a chassis that houses a printed circuit board (PCB) supporting server hardware, the chassis including a base portion that circulates liquid coolant throughout channels of a chassis coolant manifold residing in a plane below the PCB;

attaching tubing to extend between the chassis coolant manifold below the PCB and a cold plate on the PCB;

sliding the chassis into a chassis slot formed in a front side of a rack, the rack including a rack coolant manifold that flows coolant between a chassis-external coolant source and the chassis when the chassis is positioned in the chassis slot;

coupling a coolant inlet and a coolant outlet of the chassis to the rack coolant manifold at locations proximal to a back side of the rack, the rack coolant manifold having shut-off valves accessible from the front side of the rack; and flowing the liquid coolant through the chassis coolant manifold below the PCB to deliver the liquid coolant to the cold plate on top of the PCB.

11. The method of claim 10, wherein the chassis is, once inserted into the rack, accessible on the front side of the rack, and wherein the liquid coolant flows through the coolant inlet of the chassis to the coolant outlet of the chassis, wherein the coolant inlet and the coolant outlet both are located on a back side of the chassis opposite the front side of the chassis.

12. The method of claim 10, wherein the chassis coolant manifold includes channels that isolate the liquid coolant from contact with the server hardware.

13. The method of claim 10, wherein the channels of the base portion of the chassis throughout are sandwiched between first and second pieces of sheet metal substantially parallel to the PCB.

14. The method of claim 10, wherein the rack coolant manifold includes a cold channel that receives the liquid coolant from the chassis-external coolant source through a first valve on the front side of the rack and that directs the liquid coolant toward a back side of the rack and vertically along a first sidewall of the rack to distribute the liquid coolant to the chassis stored in the rack.

15. The method of claim 14, wherein the rack coolant manifold includes a hot channel that receives coolant output from the chassis and directs the liquid coolant vertically along a second sidewall and to a second valve on the front side of the rack, the second sidewall being parallel to the first sidewall.

16. The method of claim 15, wherein the cold channel includes a first connector adapted to mate with the coolant inlet of the chassis and wherein the hot channel includes a second connector adapted to mate with the coolant outlet of of the chassis when the chassis is positioned within the chassis slot.

17. The method of claim 16, wherein flowing the liquid coolant between the channels below the PCB and the cold plate includes flowing the liquid coolant through channels that wrap around an edge of the PCB.

18. A storage system comprising:

a chassis adapted to store a printed circuit board (PCB) that supports server hardware, the chassis including sidewalls and a chassis base portion underlying the server hardware and supporting the sidewalls, the chassis base portion including a chassis coolant manifold adapted to flow coolant through a liquid coolant loop that underlies the PCB; and a rack including a plurality of chassis slots each adapted to receive the chassis through a front side of the rack, the rack including a rack coolant manifold with shut-off valves located on the front side of the rack.

19. The storage system of claim 18, wherein the chassis is adapted for insertion into the rack with a front side of the chassis being accessible on a front side of the rack and wherein a coolant inlet and a coolant outlet of the chassis are coupled with the rack coolant manifold on a back side of the rack opposite the front side of the rack.

* * * * *